United States Patent
Yamamoto et al.

(10) Patent No.: US 9,406,721 B1
(45) Date of Patent: Aug. 2, 2016

(54) MEMORY DEVICE

(71) Applicant: KABUSHIKI KAISHA TOSHIBA, Tokyo (JP)

(72) Inventors: Kazuhiko Yamamoto, Yokkaichi Mie (JP); Kunifumi Suzuki, Yokkaichi Mie (JP)

(73) Assignee: Kabushiki Kaisha Toshiba, Toky (JP)

( * ) Notice: Subject to any disclaimer, the term of this patent is extended or adjusted under 35 U.S.C. 154(b) by 0 days.

(21) Appl. No.: 14/841,373

(22) Filed: Aug. 31, 2015

(30) Foreign Application Priority Data

Mar. 31, 2015 (JP) ................................. 2015-071446

(51) Int. Cl.
*H01L 47/00* (2006.01)
*H01L 27/24* (2006.01)
*H01L 45/00* (2006.01)

(52) U.S. Cl.
CPC .......... *H01L 27/2481* (2013.01); *H01L 45/144* (2013.01); *H01L 45/145* (2013.01)

(58) Field of Classification Search
CPC .. H01L 45/145; H01L 45/144; H01L 27/2481
USPC ........................................................ 257/1–2
See application file for complete search history.

(56) References Cited

U.S. PATENT DOCUMENTS

| 2008/0149913 | A1 | 6/2008 | Tanaka et al. | |
| 2011/0006277 | A1* | 1/2011 | Kubo | B82Y 10/00 257/2 |
| 2012/0313066 | A1 | 12/2012 | Park et al. | |
| 2013/0248801 | A1 | 9/2013 | Yamamoto | |
| 2014/0241050 | A1* | 8/2014 | Nakai | H01L 45/06 365/163 |

FOREIGN PATENT DOCUMENTS

JP 2009049183 A 3/2009

* cited by examiner

*Primary Examiner* — Theresa T Doan
(74) *Attorney, Agent, or Firm* — Patterson & Sheridan, LLP

(57) ABSTRACT

A memory device includes a bit line extending in a first direction, a word line extending in a second direction crossing the first direction, an insulating material between the word line and another word line, a first layer made of a Group IV element, between the word line and the insulating material and between the word line and the bit line, and a second layer made of a compound of a Group V element and a Group VI element, between the insulating material and the bit line. The word line includes a first portion that is metallic and a second portion between the first portion and the first layer. In addition, a variable resistance portion in contact with the first and second layers and the second portion of the word line, contains the Group IV element and the compound of the Group V element and the Group VI element.

20 Claims, 16 Drawing Sheets

MEMORY DEVICE

CROSS-REFERENCE TO RELATED APPLICATION

This application is based upon and claims the benefit of priority from Japanese Patent Application No. 2015-071446, filed Mar. 31, 2015, the entire contents of which are incorporated herein by reference.

FIELD

Embodiments described herein relate generally to a memory device.

BACKGROUND

Recent designs of some memory devices have memory cells that are integrated in a three-dimensional manner. In such a memory device, a plurality of word lines extending in a first direction and a plurality of bit lines extending in a second direction are provided, and a memory cell is formed at each intersection of a word line and a bit line. Further, a predetermined voltage is applied to one word line and one bit line to cause the memory cell at the intersection of the one word line and the one bit line to be selected so that writing or reading of data can be performed on the selected memory cell. However, if the memory cells are more highly integrated intersection, interference between the memory cells may occur.

DESCRIPTION OF THE DRAWINGS

FIG. 3A shows a high resistance state and FIG. 3B shows a low resistance state.

FIG. 4A shows a set operation and FIG. 4B shows a reset operation.

FIG. 6A shows a high resistance state and FIG. 6B shows a low resistance state.

FIG. 7A shows a high resistance state and FIG. 7B shows a low resistance state.

FIG. 12A is a view of the memory device according to the second embodiment and FIG. 12B is a view of a memory device according to a comparative example.

DETAILED DESCRIPTION

Figure 1:
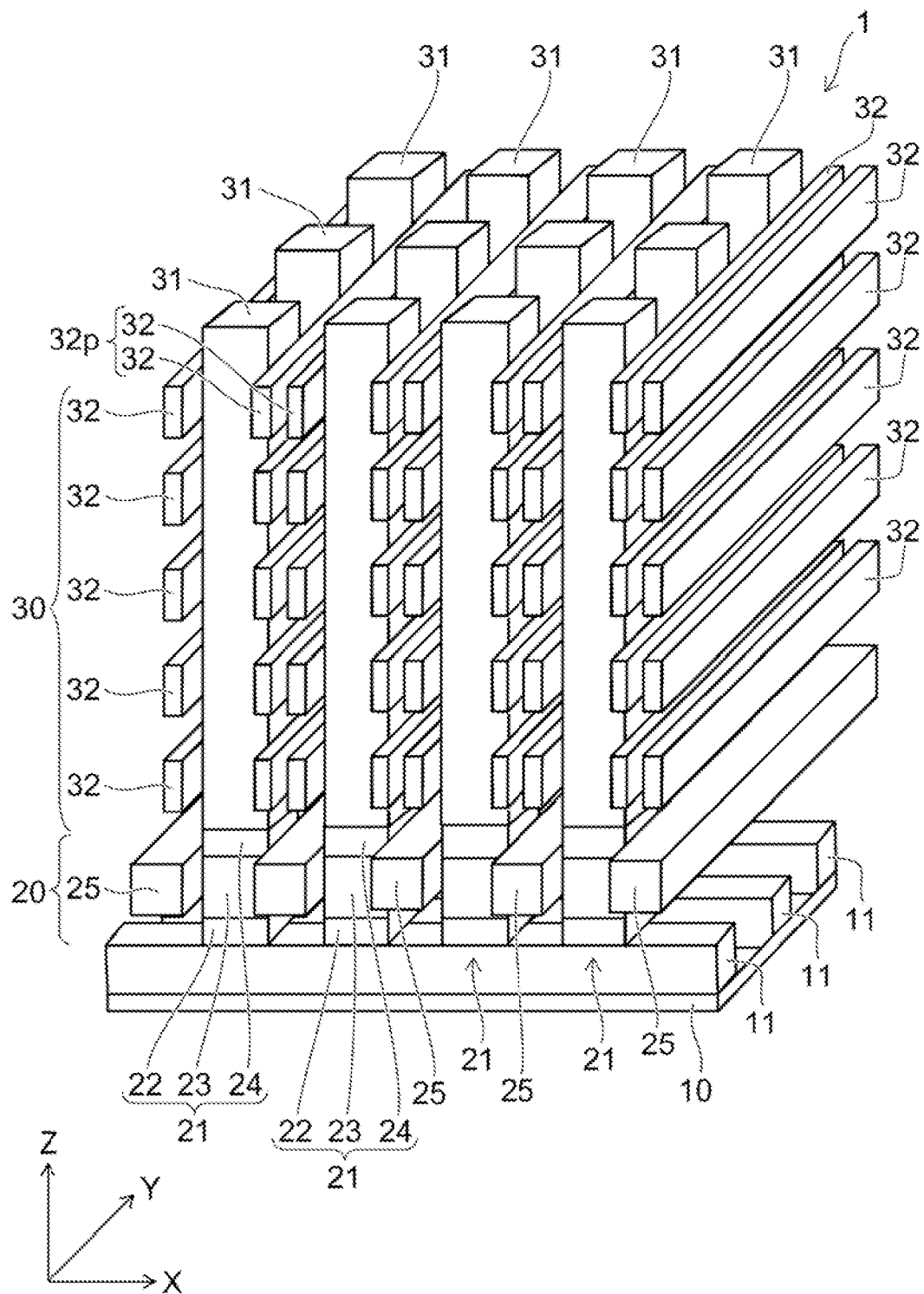
FIG. 1 is a perspective view showing a memory device according to a first embodiment.

Embodiments provide a memory device that suppresses the interference between memory cells.

In general, according to one embodiment, a memory device includes a plurality of bit lines, including first and second bit lines, extending in a first direction away from a substrate, a plurality of word lines, including first and second word lines, extending in a second direction crossing the first direction and substantially parallel to a surface of the substrate, an insulating material between the first and second word lines, a first layer made of a Group IV element, between the first word line and the insulating material and between the first word line and the first bit line, and a second layer made of a compound of a Group V element and a Group VI element, between the insulating material and the first bit line. The first word line includes a first portion that is metallic and a second portion between the first portion and the first layer. In addition, a variable resistance portion in contact with the first and second layers and the second portion of the first word line, contains the Group IV element and the compound of the Group V element and the Group VI element.

According to another embodiment, a memory device includes a plurality of bit lines, including first and second bit lines, extending in a first direction away from a substrate, a plurality of word lines, including first and second word lines, extending in a second direction crossing the first direction and substantially parallel to a surface of the substrate, an insulating material between the first and second word lines, a first layer between the first word line and the insulating material, a second layer between the insulating material and the first bit line, and a variable resistance layer between the first word line and the first bit line. The first word line includes a first portion that is metallic and a second portion between the first portion and the first layer and the first portion and the variable resistance layer. In addition, the variable resistance layer is in contact with the first and second layers, the second portion of the first word line, and the bit line, and contains a Group IV element and a compound of a Group V element and a Group VI element.

According to still another embodiment, a memory device includes a plurality of bit lines, including first and second bit lines, extending in a first direction away from a substrate, a plurality of word lines, including first and second word lines, extending in a second direction crossing the first direction and substantially parallel to a surface of the substrate, a first insulating layer between the first and second word lines, a Group IV element layer made of a Group IV element between the first word line and the first bit line, and a second insulating layer between a first portion of the first word line and the Group IV element layer but not between a second portion of the first word line and the Group IV element layer, where a thickness of the first portion is greater than a thickness of the second portion.

First Embodiment

Firstly, the first embodiment will be described.

FIG. 1 is a perspective view showing a memory device according to the embodiment.

Figure 2A:
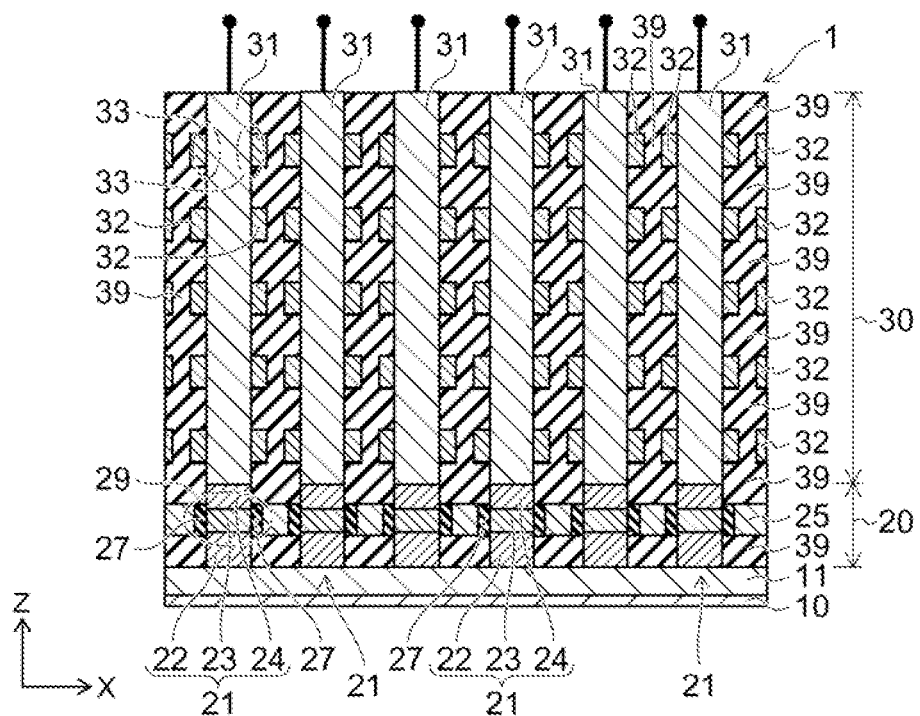
FIG. 2A and FIG. 2B are sectional views showing the memory device according to the first embodiment.
Figure 2B:
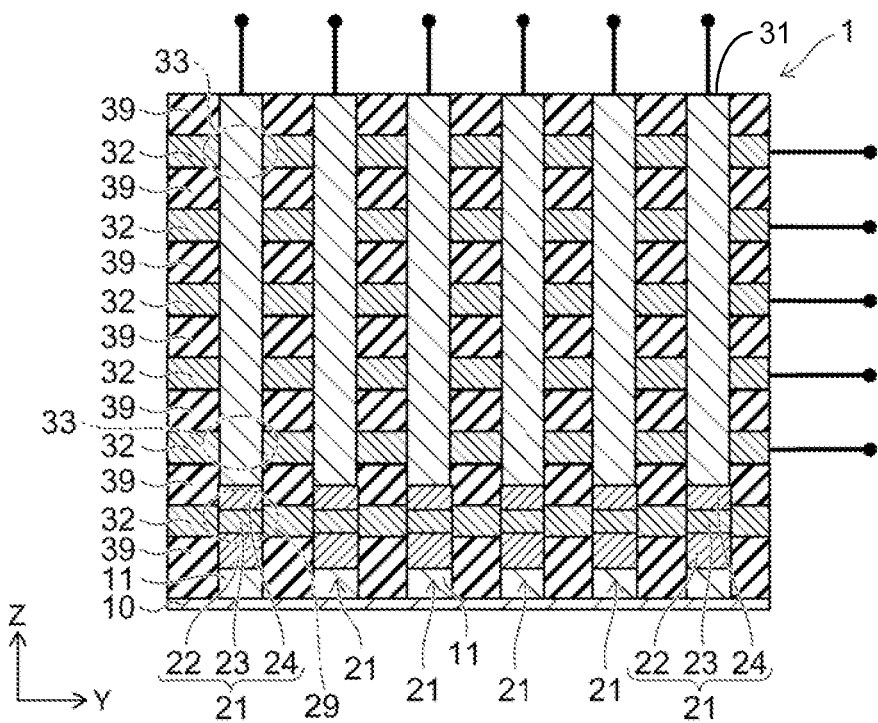

FIG. 2A and FIG. 2B are sectional views showing the memory device according to the embodiment.

Figure 3A:
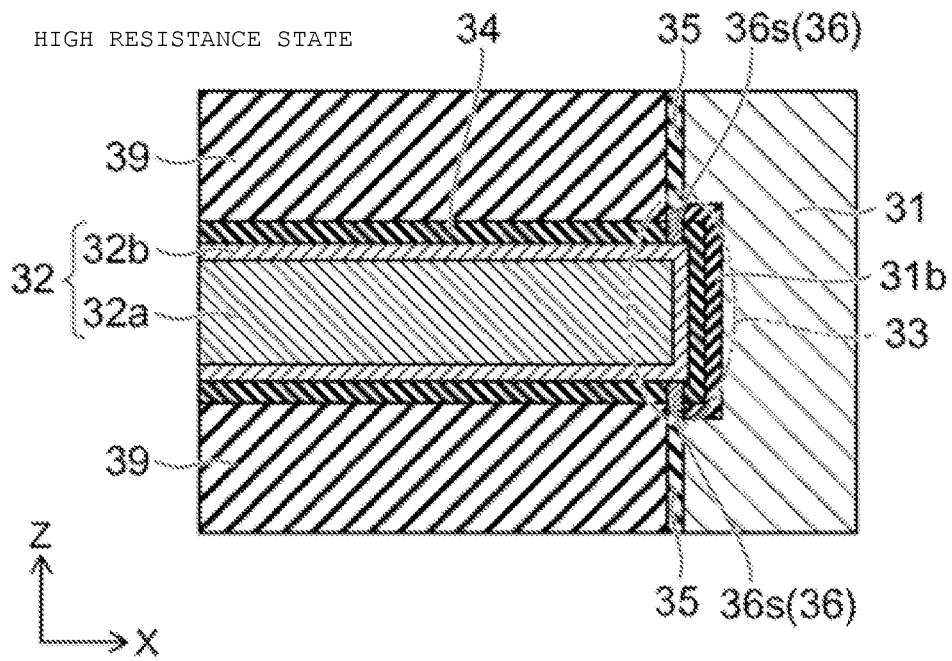
FIG. 3A and FIG. 3B are sectional views showing a memory cell of the memory device according to the first embodiment.
Figure 3B:
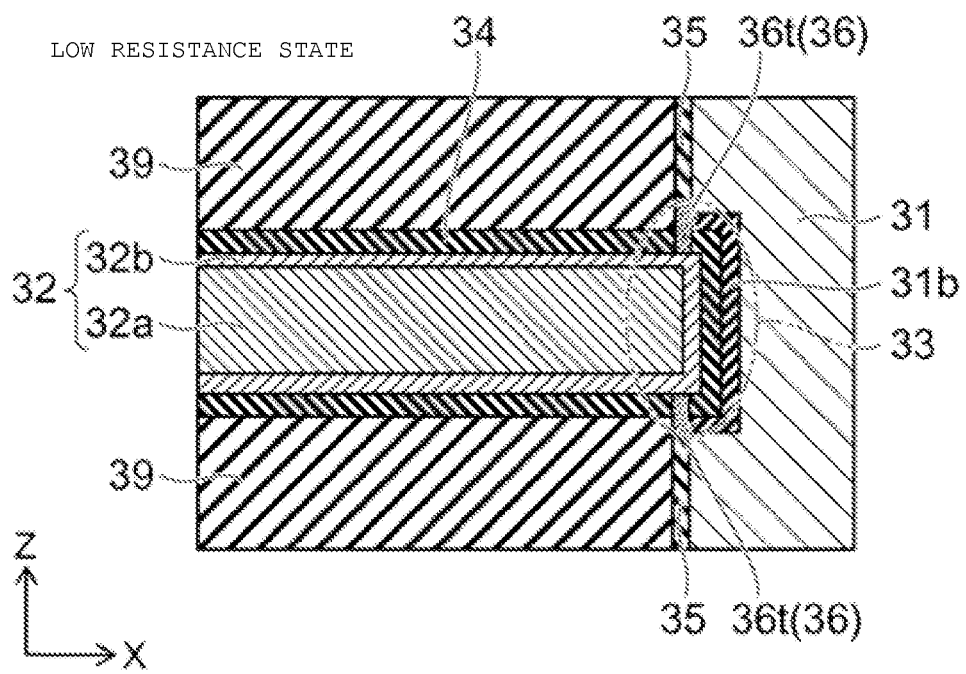

FIG. 3A and FIG. 3B are sectional views showing a memory cell of the memory device according to the embodiment, where FIG. 3A shows a high resistance state and FIG. 3B shows a low resistance state.

Figure 4A:
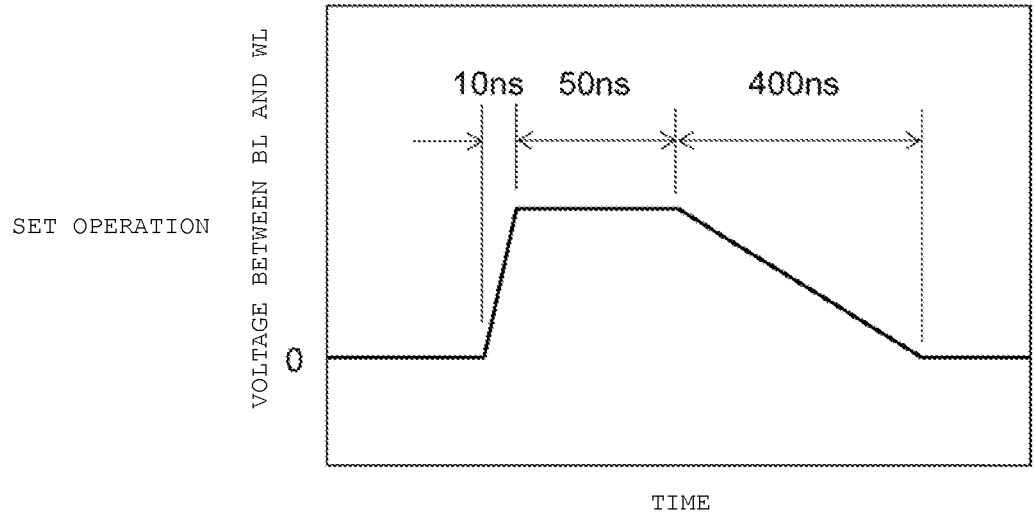
FIG. 4A and FIG. 4B are graphs, in which the horizontal axis indicates time and the vertical axis indicates voltage, showing driving signals of the memory device according to the first embodiment.
Figure 4B:
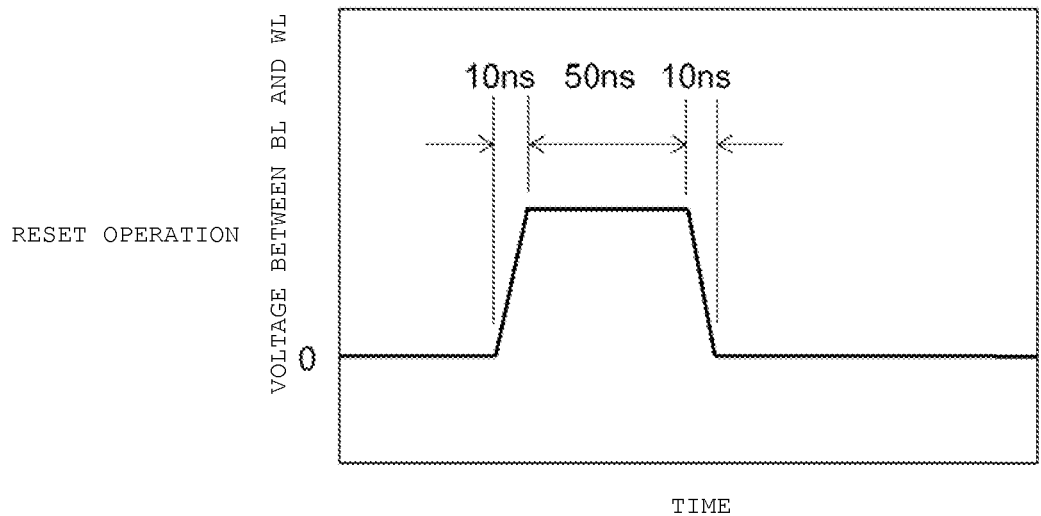

FIG. 4A and FIG. 4B are graphs, in which the horizontal axis indicates time and the vertical axis indicates voltage, showing driving signals of the memory device according to the embodiment. FIG. 4A shows a set operation and FIG. 4B shows a reset operation.

For convenience of illustration, each unit is briefly illustrated in FIG. 1, FIG. 2A and FIG. 2B. Further, FIG. 2B shows a YZ plane including local bit lines 31. Interlayer insulation films 39 existing in the front side are omitted in FIG. 2B in order to show gate electrodes 25 and local word lines 32. In the drawing, side surfaces of both the gate electrodes 25 and the local word lines 32 are shown with hatching so as to be easily seen.

The memory device according to the embodiment is a phase change random access memory (PCRAM).

As shown in FIG. 1, FIG. 2A and FIG. 2B, the memory device 1 according to the embodiment is provided with a silicon substrate 10.

Hereinafter, for convenience of description, in the specification, XYZ orthogonal coordinate system is used. Two directions which are in parallel to the top face of the silicon substrate 10 and also are orthogonal to each other, correspond to "the X direction" and "the Y direction", respectively, and a direction which is normal to the top face of the silicon substrate 10 corresponds to "the Z direction".

A plurality of global bit lines 11 extending in the X direction are provided on the silicon substrate 10. The plurality of global bit lines 11 are periodically arranged in the Y direction. The global bit lines 11 are formed such that, for example, the upper layer portion of the silicon substrate 10 is divided by element separating insulators (not shown), or the global bit lines 11 are formed of polysilicon on an insulation film (not shown) which is provided on the silicon substrate 10. Wiring selecting units 20 are provided over the global bit lines 11, and memory units 30 are provided over the wiring selecting units 20.

A plurality of semiconductor members 21 are provided in the wiring selecting unit 20. The plurality of semiconductor members 21 are arranged in a matrix-like shape in the X direction and the Y direction, and each semiconductor member 21 extends in the Z direction. Further, the plurality of semiconductor members 21 which are arranged in a row in the X direction are commonly connected to one global bit line 11. In each semiconductor member 21, starting from the low side, i.e., starting from the global bit lines 11, an n+ type portion 22, a p− type portion 23 and an type portion 24 are sequentially arranged in the order listed in the Z direction. Alternatively, the position of the n type portion and the p type portion may be reversed.

The gate electrodes 25 extending in the Y direction are provided between each semiconductor member 21 in the X direction. The gate electrodes 25 are at the same level in the Z direction. Further, when seen in the X direction, the gate electrode 25 overlaps the upper portion of the type portion 22, the entire p− type portion 23 and the lower portion of the type portion 24. A gate insulation film 27 formed of, for example, silicon oxide is provided between the semiconductor member 21 and the gate electrodes 25. A thin film transistor (TFT) 29 of an n channel type includes the semiconductor member 21 which includes the n+ type portion 22, the p− type portion 23 and the type portion 24, the gate insulation film 27, and the gate electrode 25.

The memory unit 30 is provided with a plurality of local bit lines 31. The plurality of local bit lines 31 are arranged in a matrix-like shape in the X direction and the Y direction, and each local bit line 31 extends in the Z direction. The local bit line 31 is formed of, for example, metallic material such as tungsten (W). Alternatively, the local bit line 31 may be formed of polysilicon. Further, the lower end of each local bit line 31 connects to the upper end of each semiconductor member 21. Accordingly, the lower end of each local bit line 31 connects to the global bit line 11 through each semiconductor member 21.

The local word lines 32 are provided between adjacent local bit lines 31 in the X direction. The local word lines 32 extend in the Y direction, are arranged in two rows on sides of the local bit lines 31 in the X direction, and are arranged in plural stages in the Z direction. In other words, in an XZ cross section, one local bit line 31 and two rows of local word lines 32 are alternatively arranged in the X direction. An interlayer insulation film 39 formed of silicon oxide film is provided between each of the global bit lines 11, the semiconductor member 21, the gate electrodes 25, the local bit lines 31 and the local word lines 32. A portion of the interlayer insulation film 39 is also arranged between two local word lines 32 which are arranged between adjacent local bit lines 31 in the X direction.

As shown in FIG. 3A and FIG. 3B, a main body unit 32a formed of, for example, tungsten is provided in the local word line 32, and a barrier metal layer 32b formed of, for example, titanium nitride (TiN) is provided on the top face, the bottom surface, and the side surface facing the local bit line 31, of the main body unit 32a. The local word line 32 includes the main body unit 32a and the barrier metal layer 32b. Alternatively, the barrier metal layer 32b may not be provided.

Further, a germanium (Ge) layer 34 formed of germanium is provided on the top face, the bottom surface, and the side surface facing the local bit line 31, of the local word line 32, that is, on the surface of the barrier metal layer 32b. On the other hand, an insulating tungsten oxide layer 31b formed of, for example, tungsten oxide, is provided on the side surface facing the local word line 32 of each local bit line 31. The Ge layer 34 connects to the local bit line 31 through the tungsten oxide layer 31b. Further, an antimony-tellurium ($Sb_2Te_3$) layer 35 formed of antimony-tellurium alloy is provided between the local bit line 31 and the interlayer insulation film 39. The $Sb_2Te_3$ layer 35 corresponds to, for example, a super lattice layer.

An $Sb_2Te_3$ area 36s in which germanium locally exists, or an $Sb_2Te_3$ area 36t in which germanium is diffusely distributed (hereinafter referred to as "GeSbTe layer 36" in generic term) is provided between the Ge layer 34 and the $Sb_2Te_3$ layer 35. In other words, the GeSbTe layer 36 may take the first state where the Sb$_2$Te$_3$ area 36s in which germanium that locally exists is dominant and the second state where the Sb$_2$Te$_3$ area 36t in which germanium that is diffusely distributed is dominant. Further, "to locally exist" means that there is an area or areas having a germanium concentration of 99 or more at % in the GeSbTe layer 36. If such an area is interposed in a current path, the resistance value of the GeSbTe layer 36 relatively increases. On the other hand, "to be diffusely distributed" means that there is no area having a germanium concentration of 99 or more at % in the GeSbTe layer 36. According to the configuration, since the germanium concentration is smaller than 99 at % in the entire current path, the resistance value of the GeSbTe layer 36 relatively decreases. Further, a memory cell 33, in which the GeSbTe layer 36 is used as a variable resistance layer, is formed portions of between each local bit line 31 and each local word line 32.

The germanium (Ge) has a resistivity greater than a resistivity of the antimony-tellurium (Sb$_2$Te$_3$). Accordingly, as shown in FIG. 3A, when the GeSbTe layer 36 is the Sb$_2$Te$_3$ area 36s in which germanium locally exists, the resistance value between the local bit line 31 and the local word line 32 is relatively high, and the memory cell 33 is in a high resistance state. On the other hand, as shown in FIG. 3B, when the GeSbTe layer 36 is the Sb$_2$Te$_3$ area 36t in which germanium is diffusely distributed, the memory cell 33 is in a low resistance state.

As shown in FIG. 4A, in a transition operation where the memory cell 33 transitions from a high resistance state to a low resistance state, that is, in a set operation, a set voltage, in which the local bit line 31 acts as a positive pole and the local word line 32 acts as a negative pole with respect to the memory cell 33, is increased up to a defined value, for example, for 10 ns (nano seconds). Further, after the increased voltage is applied, for example, for 50 ns (nano seconds), and the voltage is decreased down to zero, for example, for 400 ns. The pulse width (a voltage applying time) during the applying of the voltage is typically 50 ns or more. Further, the pulse width may be also smaller than 50 ns in consideration of a film thickness, a material or a composition of the GeSbTe layer 36. The pulse width may be a size which causes the voltage to increase up to a predetermined voltage. When the pulse width is small, since it is considered that the voltage is unlikely to increase up to a predetermined voltage due to a wiring delay, the short pulse width may be set to be longer. Further, a pulse rising time is, for example, 10 ns or less, but the pulse rising time may be 10 ns or more in many situations. According to the operation, the Ge layer 34 coheres to the local word line 32 of a low voltage (low potential). After this, if the applied voltage changes to 0 V for sufficient long falling time, the GeSbTe layer 36 becomes cooled (slowly cooled) as time passes, and the cohered germanium is thermally diffused. Therefore, the Sb$_2$Te$_3$ area 36t in which the germanium is diffusely distributed is formed and the memory cell 33 is in the low resistance state.

On the other hand, in a transition operation where the memory cell 33 transitions from a low resistance state to a high resistance state, that is, in a reset operation, a reset voltage, in which the local bit line 31 acts as a negative pole and the local word line 32 acts as a positive pole with respect to the memory cell 33, is increased up to a defined value, for example, for 10 ns. Further, after the increased voltage is applied, for example, for 50 ns (nano seconds), the voltage is decreased up to zero, for example, for 10 ns. According to the operation, the Ge layer 34 coheres to the local word line 32 of a low voltage (low potential). After this, if the applied voltage changes to 0 V for a short falling time, the GeSbTe layer 36 becomes cooled (slowly cooled) for a short time. Therefore, the Sb$_2$Te$_3$ area 36s in which the cohered germanium locally exists is formed, and as a result, the memory cell 33 is in the high resistance state.

Hereinafter, a manufacturing method of the memory device according to the embodiment will be described.

Figure 5A:
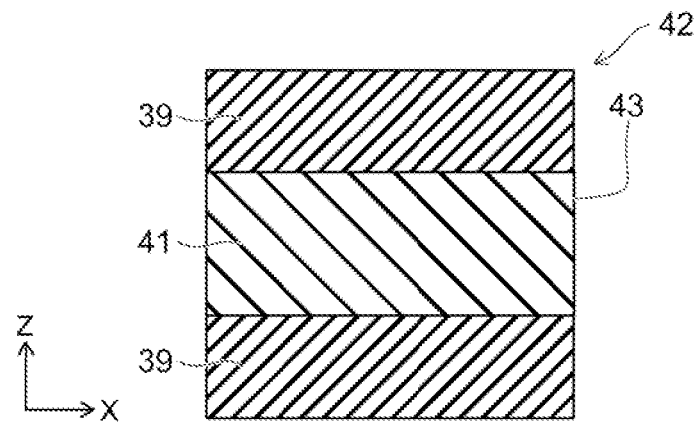
FIG. 5A to FIG. 5C are sectional views showing a manufacturing method of the memory device according to the first embodiment.
Figure 5B:
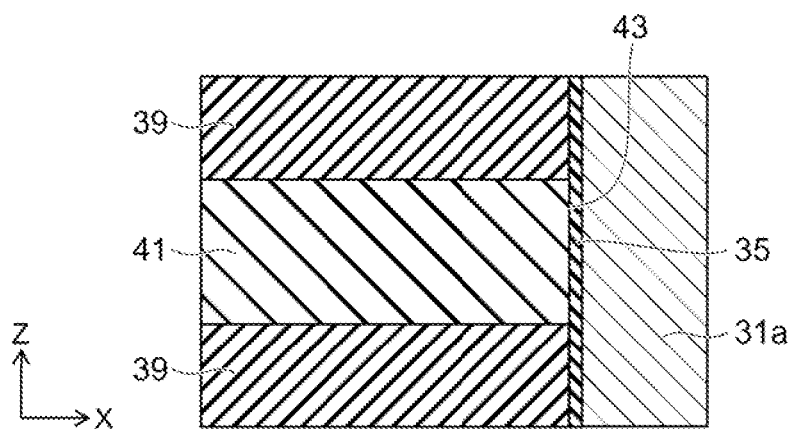
Figure 5C:
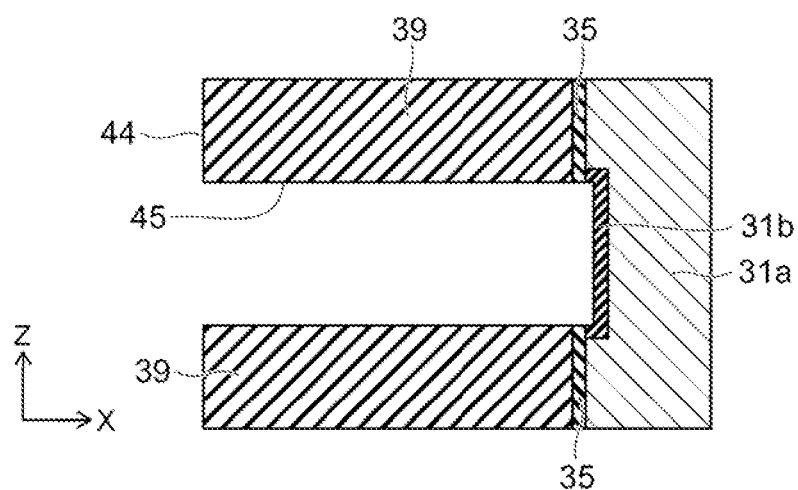

FIG. 5A to FIG. 5C are sectional views showing a manufacturing method of the memory device according to the embodiment.

Firstly, as shown in FIG. 1, FIG. 2A and FIG. 2B, according to a typical method, a plurality of global bit lines 11 are formed on the silicon substrate 10, and the wiring selecting unit 20 is formed on the global bit lines 11.

Subsequently, as shown in FIG. 5A, the interlayer insulation film 39 and a sacrificial film 41 are alternatively stacked on the wiring selecting unit 20 and thus a stacked layer body 42 is formed. For example, the interlayer insulation film 39 is formed of silicon oxide, and the sacrificial film 41 is formed of silicon nitride. Subsequently, the stacked layer body 42 is subjected to, for example, an anisotropic etching such as a reactive ion etching (RIE), and thus slits 43 which become widened along the YZ plane are formed.

Subsequently, as shown in FIG. 5B, antimony and tellurium are deposited on the side surface of the slit 43 so as to form the Sb$_2$Te$_3$ layer 35. Alternatively, an antimony-tellurium based compound may be deposited. Subsequently, a tungsten film 31a is formed on the Sb$_2$Te$_3$ layer 35 so as to cause the internal portion of the slit 43 to be filled.

Subsequently, as shown in FIG. 5C, for example, the RIE is performed to form a slit 44 which becomes widened along the YZ plane in a portion which is separate from the slit 43 in the stacked layer body 42. Further, an isotropic etching is performed through the slit 44 so as to cause the interlayer insulation film 39 to remain, and cause the sacrificial film 41 to be removed. For example, when the sacrificial film 41 is formed of the silicon nitride, a wet etching in which thermal phosphoric acid is used as an etching solution is performed. Accordingly, a recess 45 communicating with the slit 44 is formed between adjacent interlayer insulation films 39 in the Z direction. The recess 45 penetrates through the Sb$_2$Te$_3$ layer 35 and into the internal portion of the tungsten film 31a. Subsequently, a wet processing, for example, dipping into pure water is performed. Accordingly, a portion of the tungsten film 31a that is exposed to the recess 45 is oxidized and thus the tungsten oxide layer 31b is formed.

Subsequently, as shown in FIG. 3A, germanium is deposited on the internal face of the recess unit 45 through the slit 44, and thus the Ge layer 34 is formed. The Ge layer 34 contacts the tungsten oxide layer 31a, the Sb$_2$Te$_3$ layer 35 and the interlayer insulation film 39. Subsequently, titanium nitride is deposited and thus the titanium nitride layer is formed on the surface of the Ge layer 34. Subsequently, tungsten is deposited so as to cause the internal portion of the recess unit 45 to be filled and thus a tungsten film is formed. Subsequently, the tungsten film and the titanium nitride layer which are deposited in the internal portion of the slit 44 are removed using etching. Accordingly, the titanium nitride layer remaining in the internal portion of the recess 45 becomes a barrier metal layer 32b, and the tungsten film remaining in the internal portion of the recess 45 becomes the main body unit 32a. Accordingly, a local word line 32 which is configured to include the barrier metal layer 32b and the main body unit 32a is formed between the adjacent interlayer insulation films 39 in the Z direction.

Subsequently, as shown in FIG. 2A and FIG. 2B, the interlayer insulation film 39 is embedded in the internal portion of the slit 44. Subsequently, the tungsten film 31a and the Sb$_2$Te$_3$ layer 35 which are formed in the internal portion of each slit 43 are divided separately in the Y direction. Accordingly, the tungsten film 31a is divided into a plurality of local bit lines 31, and the $Sb_2Te_3$ layer 35 is divided into several pieces for each local bit line 31. Subsequently, the interlayer insulation film 39 is embedded between the local bit lines 31.

Subsequently, forming processing is performed. In other words, a forming voltage, in which the local bit line 31 acts as a positive pole and the local word line 32 acts as a negative pole, is applied between the local bit line 31 and the local word line 32. Accordingly, germanium atoms contained in the Ge layer 34 are locally diffused in the internal portion of the $Sb_2Te_3$ layer 35, and antimony and tellurium atoms contained in the $Sb_2Te_3$ layer 35 are locally diffused in the Ge layer 34, and thus the GeSbTe layer 36 is formed. Alternatively, the forming processing may be performed using a heat treatment. Accordingly, the memory device 1 according to the embodiment is manufactured.

Hereinafter, the effect according to the embodiment will be described.

As shown in FIG. 3A and FIG. 3B, in the memory cell 33 according to the embodiment, only the resistance of the GeSbTe layer 36 formed between the local word line 32 and the $Sb_2Te_3$ layer 35 changes. Further, the GeSbTe layer 36 is divided separately between the adjacent memory cells 33 in the X direction, the Y direction and the Z direction. Accordingly, the interference between the adjacent memory cells 33 may be suppressed and also unintended activation of the apparatus may be suppressed. If the interference between the memory cells is suppressed, the memory device 1 may be easily miniaturized.

Further, when the memory cell 33 is in the low resistance state, the current which flows from the local bit line 31 to the local word line 32 mostly flows through the GeSbTe layer 36 that includes the $Sb_2Te_3$ area 36t in which the germanium is diffusely distributed or the $Sb_2Te_3$ area 36s in which the germanium locally exists. For this reason, the areas heated during the set operation and the reset operation are limited to the GeSbTe layer 36 and the vicinity of the GeSbTe layer 36, and the degree of the heating intensity for heating the GeSbTe layer 36 of the adjacent memory cells is low. Accordingly, the interference between the memory cells 33 may be also suppressed.

Further, As shown in FIG. 5C, in the embodiment, when an etching is used to form the recess 45, the tip end of the recess 45 extends into the internal portion of the tungsten film 31a. In this case, the length of the recess 45 into the tungsten film. 31a has a certain allowance range. Accordingly, precise control is not required for a stop position with respect to the etching for forming the recess 45. For this reason, the memory device according to the embodiment may be easily manufactured.

As such, according to the embodiment, even if the miniaturization is performed, the interference between the memory cells is suppressed and thus an operationally stable memory device may be easily manufactured.

Further, as materials for the Ge layer 34, instead of germanium (Ge), elements belonging to the fourteenth group (group IV) other than germanium may be used. For example, silicon (Si) or carbon (C) may be used. Further, instead of the $Sb_2Te_3$ layer 35, a compound layer may be used which is formed of an element belonging to the fifteenth group (group V) other than antimony and an element of the sixteen group (chalcogen). Further, a chalcogen compound layer of a transition metal may be used. For example, bismuth-tellurium (BiTe) layer may be used.

First Modification Example of First Embodiment

Hereinafter, the first modification example of the first embodiment will be described.

Figure 6A:
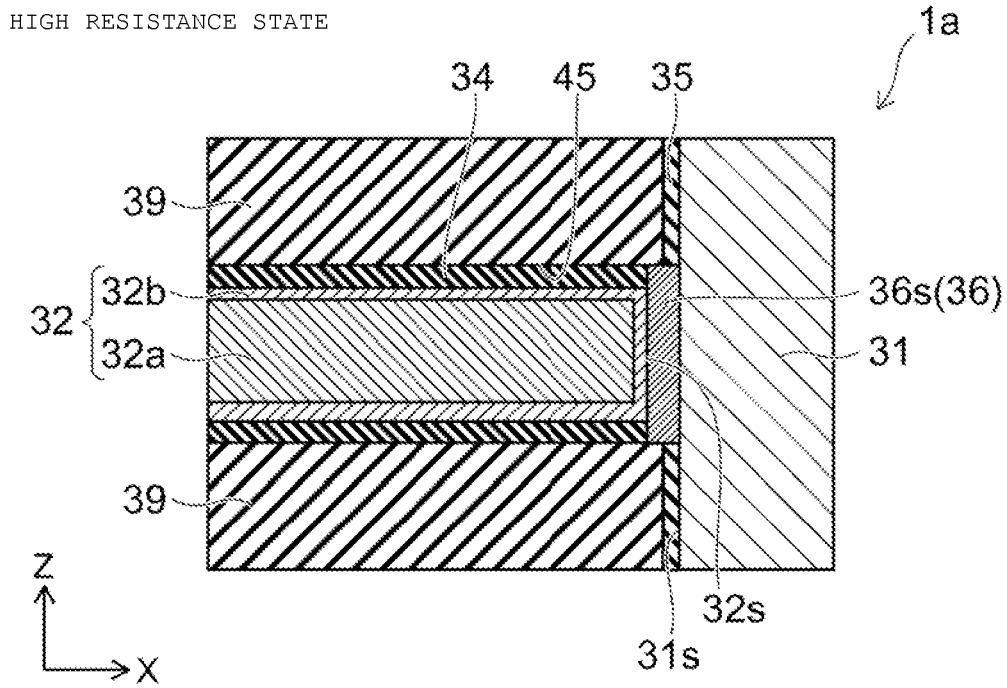
FIG. 6A and FIG. 6B are sectional views showing a memory cell of the memory device according to the first modification example of the first embodiment.
Figure 6B:
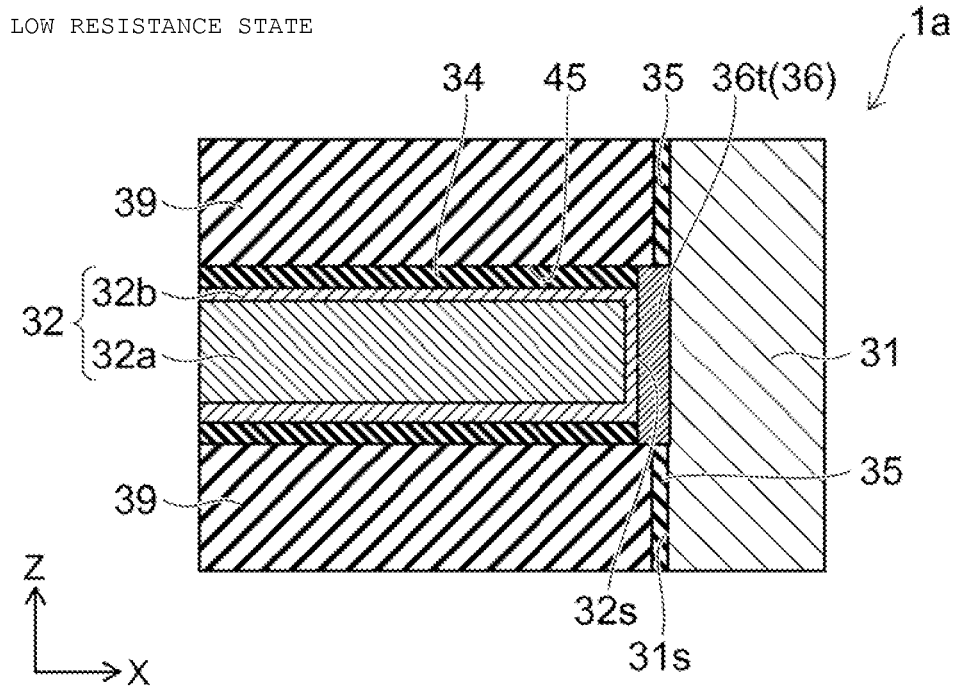

FIG. 6A and FIG. 6B are sectional views showing a memory cell of the memory device according to the first modification example. FIG. 6A shows a high resistance state and FIG. 6B shows a low resistance state.

As shown in FIG. 6A, in the memory device 1a according to the modification example, the recess 45 does not penetrate through the $Sb_2Te_3$ layer 35, and a GeSbTe layer 36 is provided in substantially the entire area between the local bit line 31 and the local word line 32. Accordingly, the GeSbTe layer 36 has a plate-like shape which becomes widened along the YZ plane. Further, the GeSbTe layer 36 comes in surface-contact with the side surface 31s of the local bit line 31 and the side surface 32s of the local word line 32, respectively.

Accordingly, as shown in FIG. 6B, when the memory cell 33 is in the low resistance state, the GeSbTe layer 36 is formed in a plane-like shape so as to cover substantially the entire side surface 32s of the local word line 32. As a result, the current flowing in the low resistance state increases to a large amount, a ratio of a current amount flowing in the low resistance state to a current amount flowing in the high resistance state (on/off ratio) increases. Accordingly, a reading operation becomes further stabilized.

Further, also in the modification example, since the GeSbTe layer 36 as a variable resistance layer is divided separately between the adjacent memory cells 33, the interference between the memory cells 33 is suppressed. Further, since the areas heated during the set operation and the reset operation are limited to the GeSbTe layer 36 and the vicinity of the GeSbTe layer 36, the thermal influence exerted to the adjacent memory cells 33 decreases.

In the modification example, the configuration, the operation, the manufacturing method and the effect other than the description described above are the same as those of the first embodiment.

Second Modification Example of First Embodiment

Hereinafter, the second modification example of the first embodiment will be described.

Figure 7A:
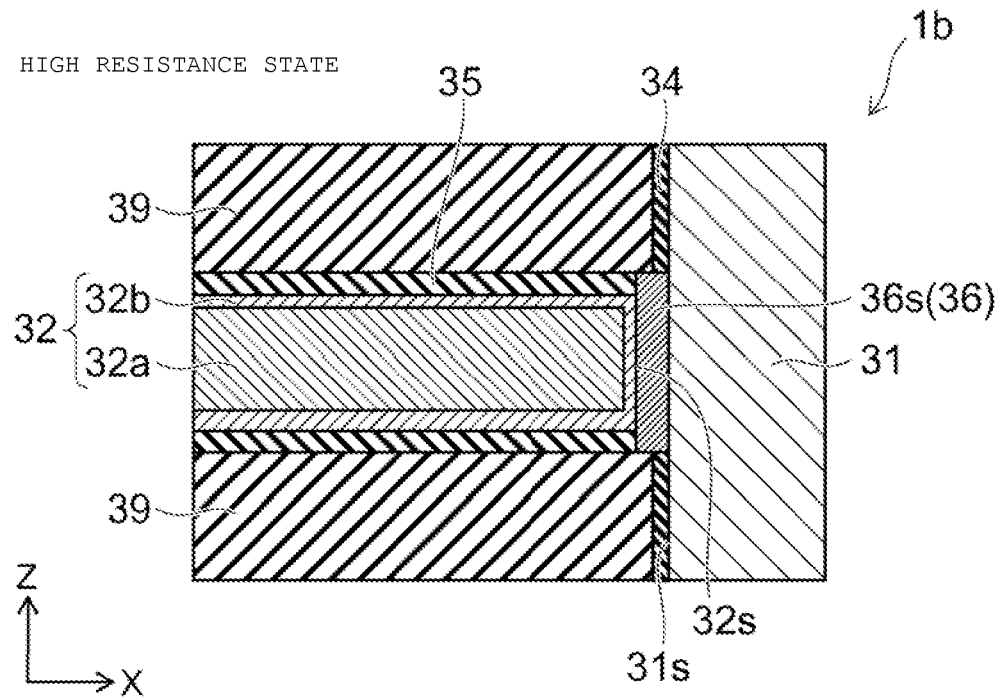
FIG. 7A and FIG. 7B are sectional views showing a memory cell of the memory device according to the second modification example of the first embodiment.
Figure 7B:
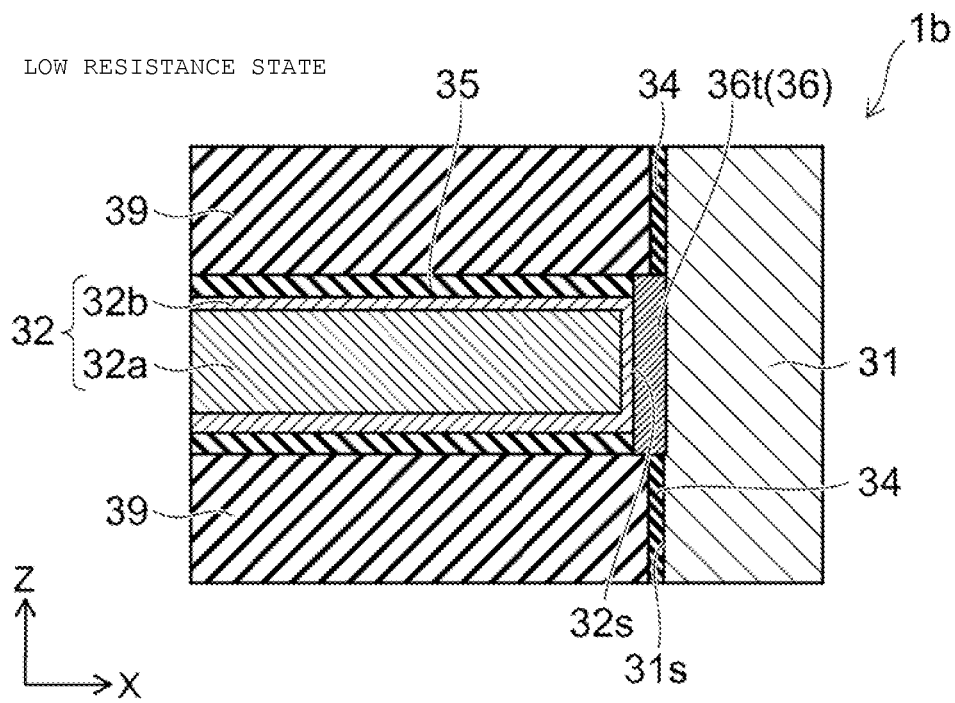

FIG. 7A and FIG. 7B are sectional views showing a memory cell of the memory device according to the second modification example. FIG. 7A shows a high resistance state and FIG. 7B shows a low resistance state.

As shown in FIG. 7A, in the memory device 1b according to the modification example, the positions of the Ge layer 34 and the $Sb_2Te_3$ layer 35 are reversed with each other, as compared with the case of the memory device 1a according to the first modification example. In other words, the Ge layer 34 is formed on the side surface 31s of the local bit line 31, and the $Sb_2Te_3$ layer 35 is formed on the top face, the bottom surface and the side surface 32s of the local word line 32.

As shown in FIG. 7B, also in this configuration, when in the low resistance state, the GeSbTe layer 36 is formed on the substantially entire side surface 32s of the local word line 32.

Also, in the modification example, the configuration, the operation, the manufacturing method and the effect other than the description described above are the same as those of the first modification example.

Second Embodiment

Hereinafter, the second embodiment will be described.

Figure 8:
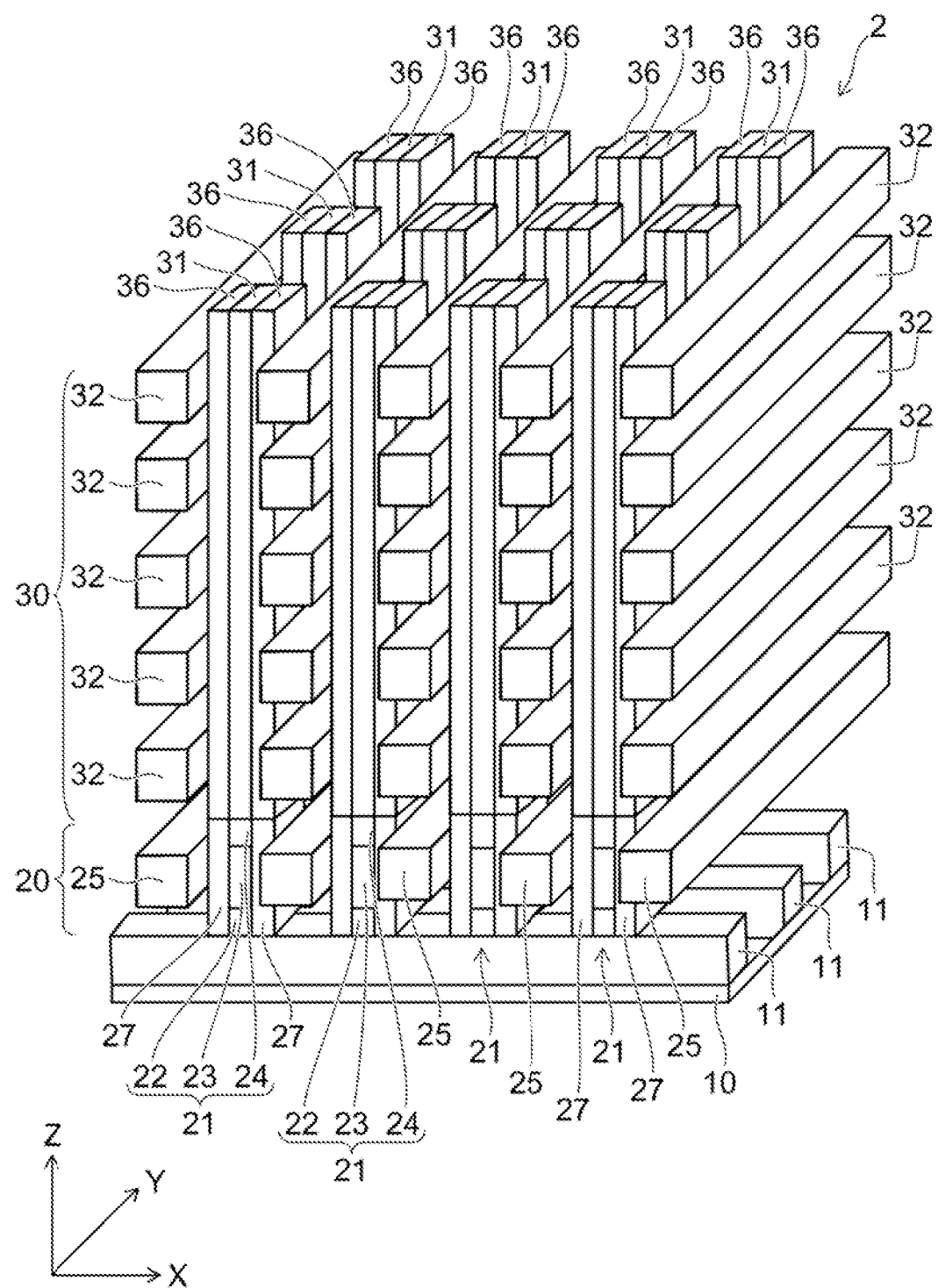
FIG. 8 is a perspective view showing a memory device according to a second embodiment.

FIG. 8 is a perspective view showing a memory device according to the embodiment.

Figure 9A:
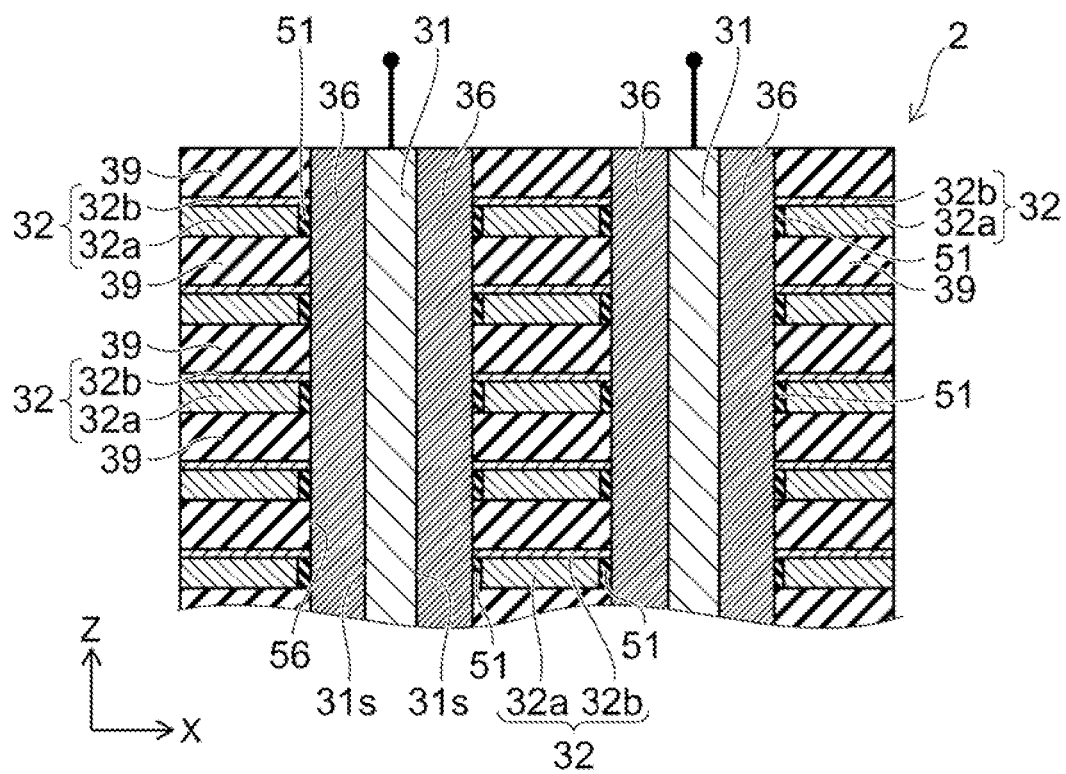
FIG. 9A is a sectional view showing the memory device according to the second embodiment and FIG. 9B is a sectional view showing a memory cell of the memory device according to the second embodiment.
Figure 9B:
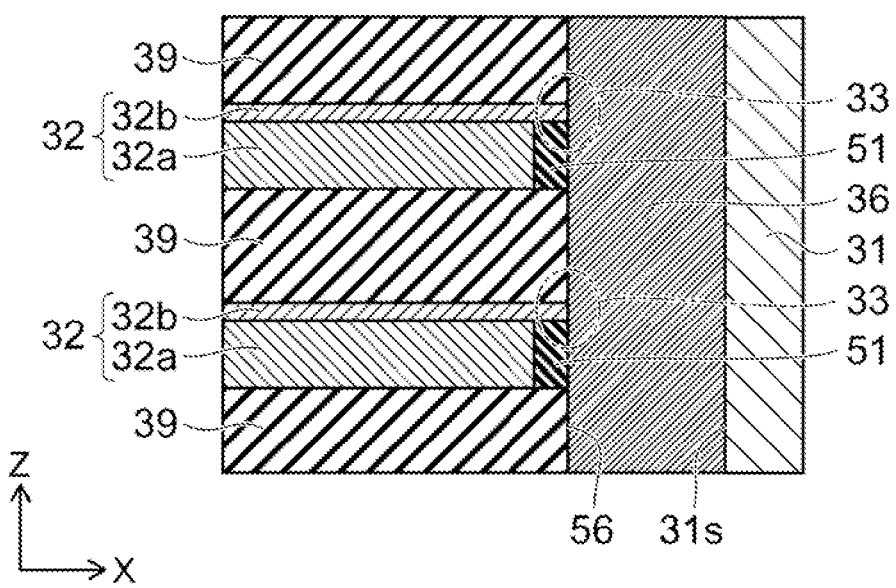

FIG. 9A is a sectional view showing the memory device according to the embodiment and FIG. 9B is a sectional view showing a memory cell of the memory device according to the embodiment.

As shown in FIG. 8 and FIG. 9A, the memory device 2 according to the embodiment is different from the memory device (see FIG. 1) according to the first embodiment in the configuration of the memory unit 30. As shown, in the memory device 2, the local word line 32 extends in the Y direction and arranged in multiple rows in the Z direction between two adjacent local bit lines 31 in the X direction. Accordingly, in an XZ plane, the local bit line 31 and the local word line 32 are alternatively arranged in the X direction.

Further, the GeSbTe layer 36 as a variable resistance layer is provided on the entire opposing side surfaces 31s of the local bit line 31 in the X direction. The GeSbTe layer 36 is a super lattice layer. Alternatively, instead of GeSbTe layer 36 of a single layer, a stacked layer film in which the Ge layer and the $Sb_2Te_3$ layer are stacked may be provided. Each GeSbTe layer 36 has a thickness in the X direction and a width in the Y direction and extends in the Z direction. Accordingly, the GeSbTe layer 36 is interposed between the local bit line 31 and the local word line 32.

As shown in FIG. 9B, for example, the main body unit 32a formed of tungsten (W) is provided in the local word line 32, and the barrier metal layer 32b formed of, for example, titanium nitride (TiN) is provided on the top face of the main body unit 32a. The barrier metal layer 32b is not provided on the bottom surface of the main body unit 32a and the side surface of the main body unit 32a facing the local bit line 31. The main body unit 32a has a thickness in the Z direction greater than a thickness of the barrier metal layer 32b in the Z direction, and the resistivity of the main body unit 32a is smaller than the resistivity of the barrier metal layer 32b.

Further, an insulation member 51 formed of, for example, silicon oxide ($SiO_2$) is provided between the main body unit 32a and the GeSbTe layer 36. However, the insulation member 51 is not provided between the barrier metal layer 32b and the GeSbTe layer 36. For this reason, the barrier metal layer 32b is arranged on the insulation member 51, and the side surface of the barrier metal layer 32b contacts with the GeSbTe layer 36. Accordingly, the current flowing from the local bit lines 31 to the local word line 32 through the GeSbTe layer 36 passes through a portion which is arranged on the insulation member 51 in the barrier metal layer 32b.

Hereinafter, the manufacturing method of the memory device according to the embodiment will be described.

FIG. 10A to FIG. 10C, FIG. 11A and FIG. 11B are sectional views showing a manufacturing method of the memory device according to the embodiment.

Firstly, as shown in FIG. 8, according to a typical method, a plurality of global bit lines 11 are formed on the silicon substrate 10, and the wiring selecting unit 20 is formed on the global bit lines 11.

Figure 10A:
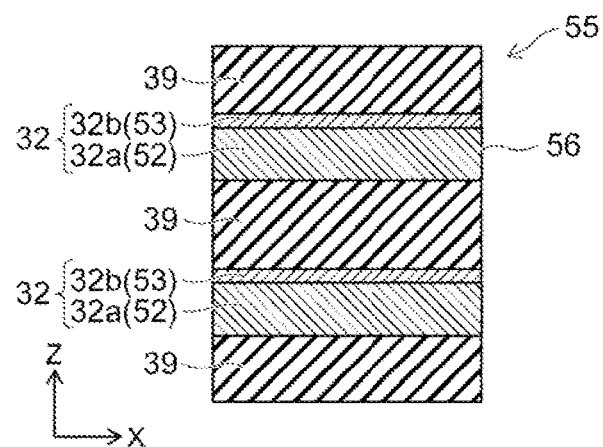
FIG. 10A to FIG. 10C are sectional views showing a manufacturing method of the memory device according to the second embodiment.

Subsequently, as shown in FIG. 10A, the interlayer insulation film 39 formed of, for example, silicon oxide, a tungsten film 52 formed of, for example, tungsten, and a titanium nitride film 53 formed of titanium nitride are repeatedly formed in the order listed on the wiring selecting unit 20. Accordingly, a stacked layer body 55 is formed. Alternatively, the tungsten film 52 and the titanium nitride film 53 may be stacked in the reverse order. Subsequently, slits 56 which become widened along the YZ plane are formed in the stacked layer body 55. Accordingly, the slit 56 causes the tungsten film 52 and the titanium nitride film 53 to be divided into the main body unit 32a and the barrier metal layer 32b of the local word line 32, respectively.

Figure 10B:
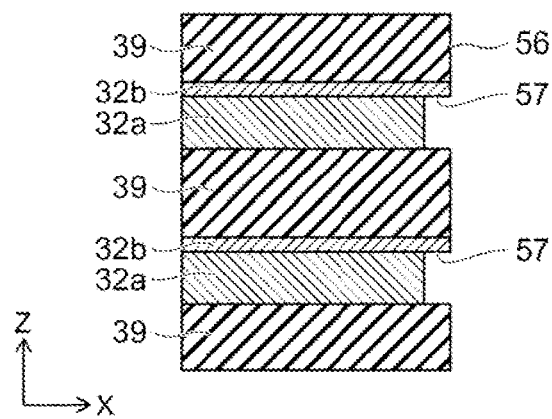

Subsequently, as shown in FIG. 10B, an isotropic etching is performed through the slit 56. The etching is based on the condition that tungsten is etched selectively over silicon oxide and titanium nitride. Accordingly, the main body unit 32a has an area exposed to the side surface of the slit 56, and the exposed area of the main body unit is retreated and thus a recess 57 extending in the Y direction is formed.

Figure 10C:
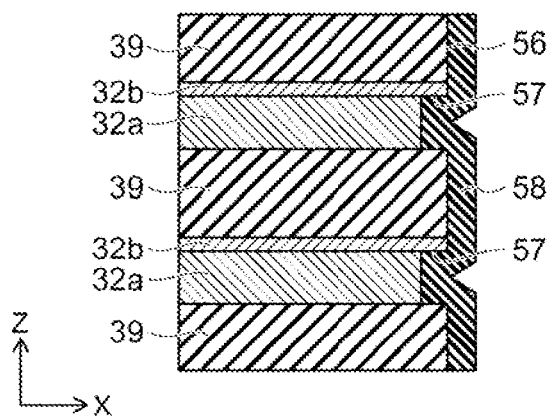

Subsequently, as shown in FIG. 10C, for example, atomic layer deposition (ALD) method is used to form a silicon oxide film 58 on the internal face of the slit 56. The silicon oxide film 58 is also embedded in the internal portion of the recess 57.

Figure 11A:
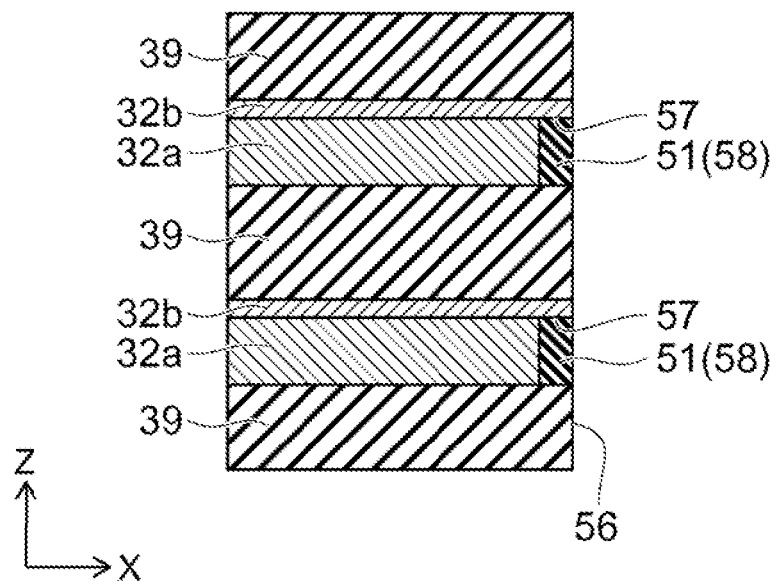
FIG. 11A and FIG. 11B are sectional views showing the manufacturing method of the memory device according to the second embodiment.

Subsequently, as shown in FIG. 11A, the silicon oxide film 58 is etched back through the slit 56 and thus a portion of the silicon oxide film 58 being deposited in the external portion of the recess 57 is removed. Accordingly, a portion of the silicon oxide film 58 remaining in the internal portion of the recess 57 becomes the insulation member 51.

Figure 11B:
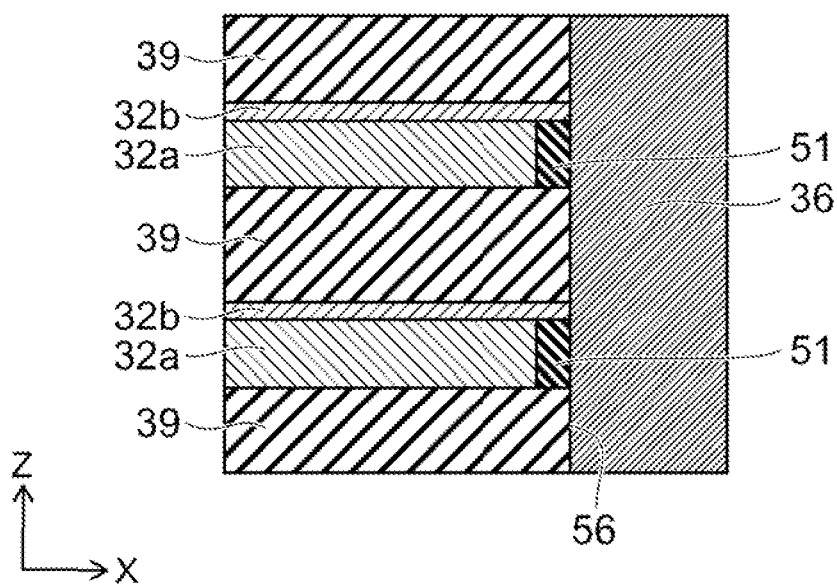

Subsequently, as shown in FIG. 11B, the GeSbTe layer 36 is formed on the internal face of the slit 56. The GeSbTe layer 36 contacts the interlayer insulation film 39, the insulation member 51 and the barrier metal layer 32b. However, the insulation member 51 causes the GeSbTe layer 36 to be separate from (not in contact with) the main body unit 32a.

Subsequently, as shown in FIG. 9A and FIG. 9B, the tungsten is deposited to cause the internal portion of the slit to be filled. Subsequently, for example, a photolithography method is used to partition tungsten and the GeSbTe layer 36 in the Y direction. Accordingly, the tungsten in the internal portion of the slit 56 is machined to form a plurality of local bit lines 31. Subsequently, the interlayer insulation film 39 is embedded between the local bit lines 31 and between the GeSbTe layers 36 in the internal portion of the slit 56. Accordingly, the memory device 2 according to the embodiment is manufactured.

Subsequently, the effect of the embodiment will be described.

Figure 12A:
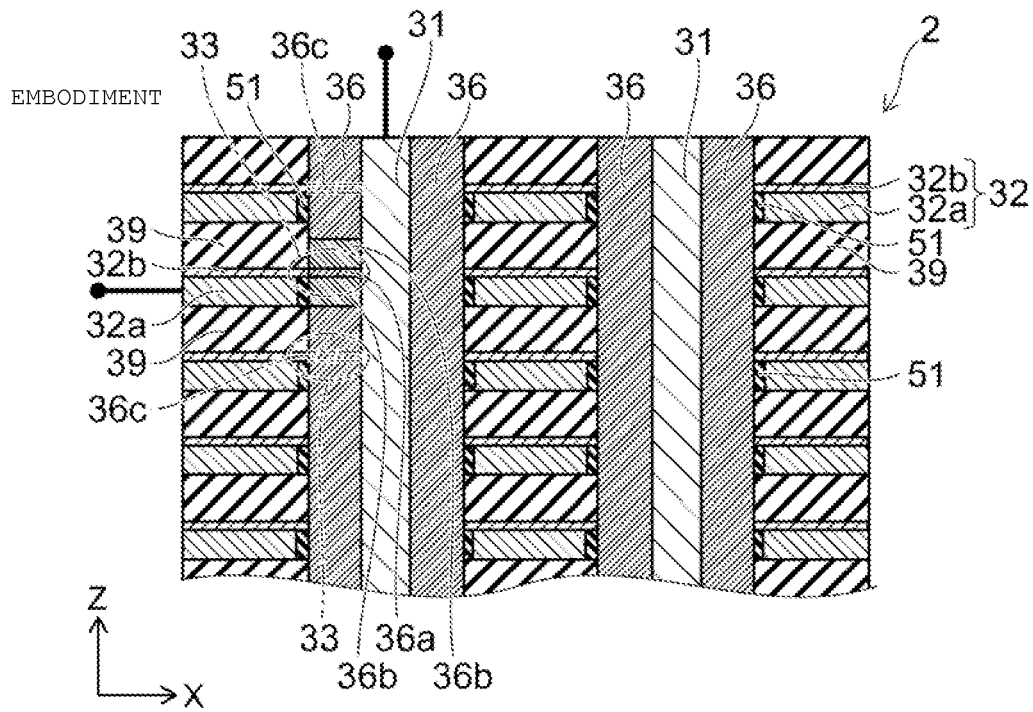
FIG. 12A and FIG. 12B are views that illustrate an effect according to the second embodiment.
Figure 12B:
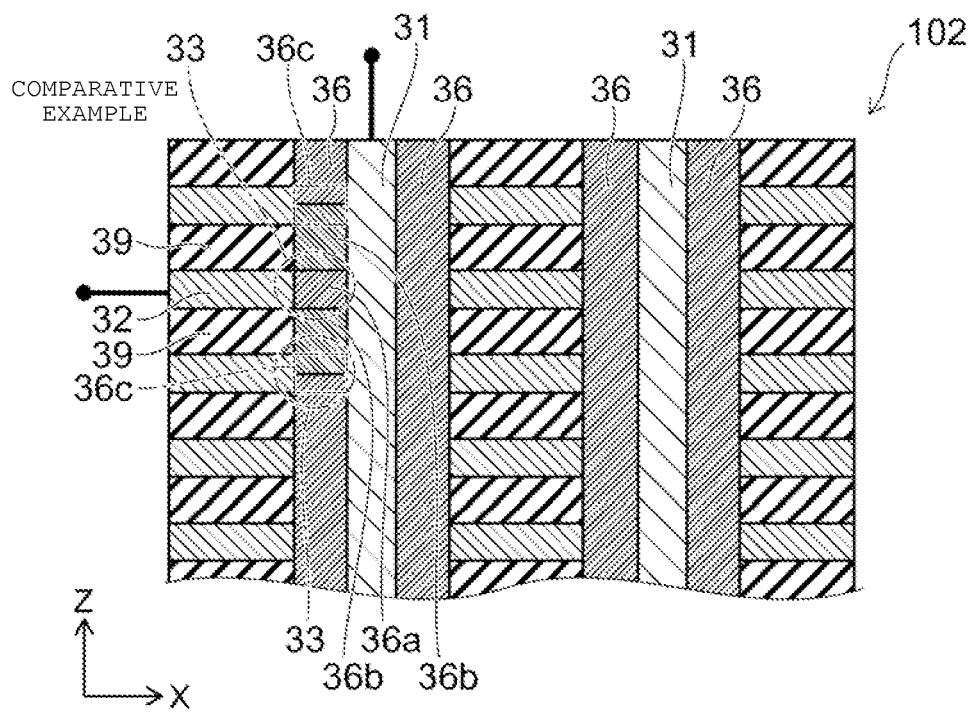

FIG. 12A and FIG. 12B are views showing an effect according to the embodiment. FIG. 12A shows the memory device according to the embodiment and FIG. 12B shows a memory device according to a comparative example.

As shown in FIG. 12A, in the memory device 2 according to the embodiment, since the insulation member 51 is provided between the main body unit 32a of the local word lines 32 and the GeSbTe layer 36, a portion between the insulation member 51 and the interlayer insulation film 39 in the current path from the local bit line 31 to the local word line 32 through the GeSbTe layer 36 is formed to be limited to the barrier metal layer 32b.

As such, the current path becomes narrowed in the vicinity of the GeSbTe layer 36. Therefore, a phase change portion 36a in the GeSbTe layer 36 also has a width which is reduced in the Z direction accordingly, and thus a thermal influence portion 36b also has a width which is reduced in the Z direction. As a result, in the GeSbTe layer 36, when a phase change portion 36a belonging to a certain memory cell 33 is phase-changed, the thermal influence portion 36b involved in this changing action may be refrained from reaching a portion 36c belonging to the adjacent memory cell 33 and may be prevented from interfering with the operation of the adjacent memory cells 33. As a result, a distance between the memory cells 33 may be reduced and thus miniaturizing of the memory device 2 may be attained.

On the other hand, as shown in FIG. 12B, since the insulation member 51 is not provided in the memory device 102 according to the comparative example, the entire side surface of the local word line 32 comes in contact with the GeSbTe layer 36. Accordingly, in the GeSbTe layer 36, the phase change portion 36a has a width which is increased in the Z direction (relative to the second embodiment), and the thermal influence portion 36b also has a width which increases in the Z direction. As a result, there is a high possibility that the thermal influence portion 36b produced due to a phase change of a certain memory cell 33 reaches the portion 36c belonging to the adjacent memory cell 33, and thus the interference is likely to occur to the adjacent memory cells 33. For example, if heat involved in the action of a certain memory cell 33 remains, and when a reset operation necessary for rapidly cooling the adjacent memory cell 33 (see FIG. 4B) is performed, the cooling is slowed, and thus there may be a case where the set operation (see FIG. 4A) occurs.

In order to avoid such interference, the distance between the memory cells 33 is required to be sufficiently increased. If this occurs, however, the miniaturization of the memory device 102 is sacrificed. Further, in order to alleviate the thermal influence, it is considered that the operational time for operating the memory cell 33 is increased. If this occurs, however, the operational speed of the memory device 102 is reduced. Further, it may be considered that the main body unit 32a and the insulation member 51 are not provided, and the local word line 32 includes only the barrier metal layer 32b. If this occurs, however, the wiring resistance of the local word lines 32 is increased and thus the current necessary for the operation of the apparatus may not be supplied sufficiently.

Modification Example of Second Embodiment

Subsequently, the modification example of the second embodiment will be described.

Figure 13:
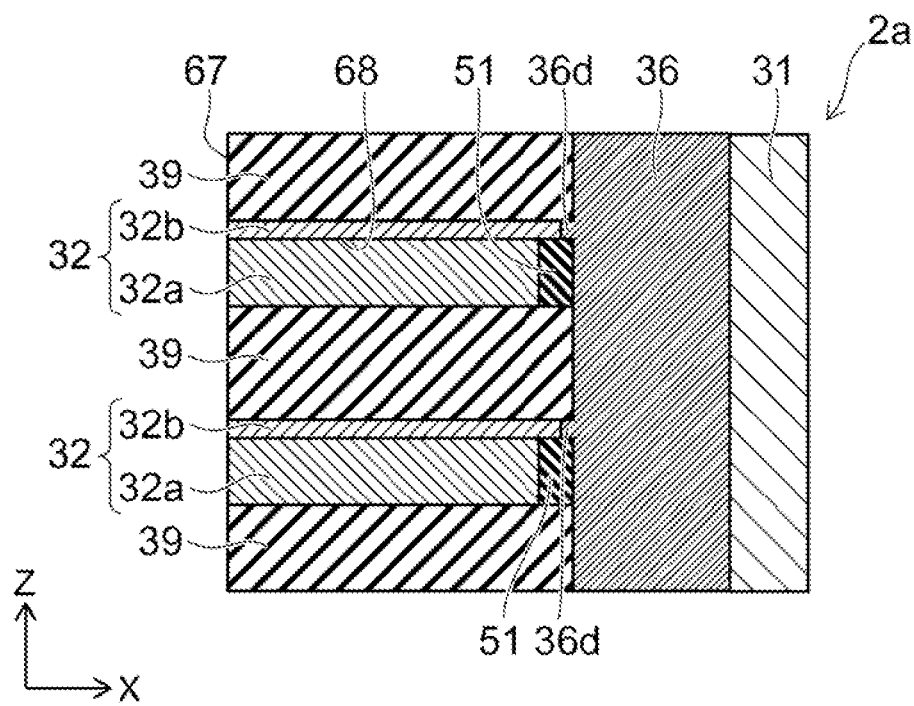
FIG. 13 is a sectional view showing the memory device according to a modification example of the second embodiment.

FIG. 13 is a sectional view showing the memory device according to the modification example.

The entire configuration of the memory device according to the modification example is similar to the configuration shown in FIG. 1. In other words, two local word lines 32 arranged in the X direction are arranged between two adjacent local bit lines 31 in the X direction.

As shown in FIG. 13, in the memory device 2a according to the modification example, a portion 36d of the GeSbTe layer 36 extends out on the insulation member 51. Accordingly, the side surface of the barrier metal layer 32b and the tip end face of the portion 36d of the GeSbTe layer 36 come in contact with each other in a position between the insulation member 51 and the interlayer insulation film 39 above the insulation member 51.

Hereinafter, the manufacturing method of the memory device 2a according to the modification example will be described.

FIG. 14A to FIG. 14C, FIG. 15A and FIG. 15B are sectional views showing a manufacturing method of the memory device according to the modification example.

Firstly, as shown in FIG. 1, according to a typical method, a plurality of global bit lines 11 are formed on the silicon substrate 10, and the wiring selecting unit 20 is formed on the global bit lines 11.

Figure 14A:
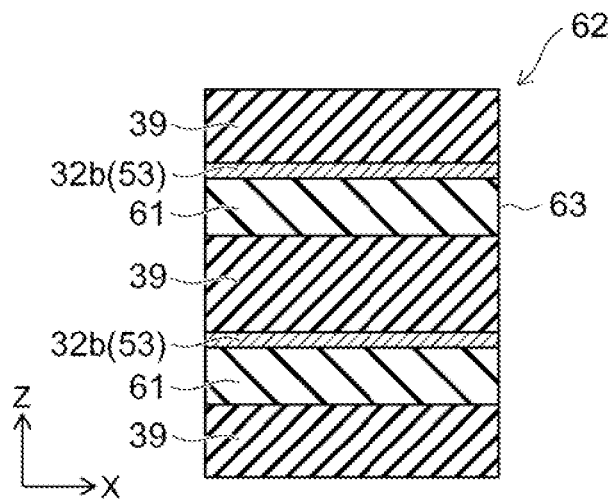
FIG. 14A to FIG. 14C are sectional views showing a manufacturing method of the memory device according to the modification example of the second embodiment.

Subsequently, as shown in FIG. 14A, the interlayer insulation film 39 formed of, for example, silicon oxide, a sacrificial film 61 formed of, for example, silicon nitride, and the titanium nitride film 53 formed of, for example, titanium nitride are repeatedly formed in the order listed on the wiring selecting unit 20. Accordingly, a stacked layer body 62 is formed. Subsequently, slits 63 which become widened along the YZ plane are formed on the stacked layer body 62. Accordingly, the slit 63 causes the titanium nitride film 53 to be divided into the barrier metal layer 32b of the local word line 32.

Figure 14B:
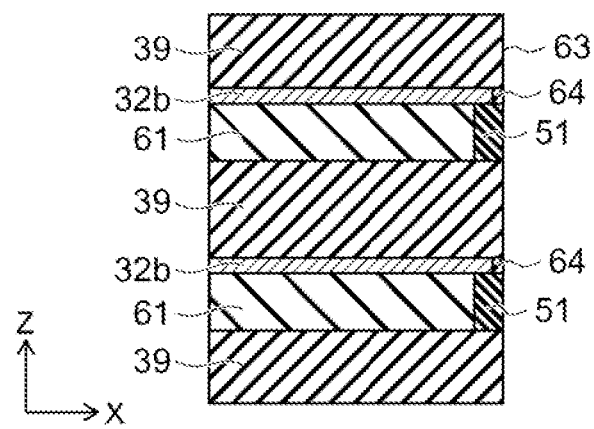

Subsequently, as shown in FIG. 14B, for example, oxidation species such as nitrogen monoxide ($N_2O$) or the like is used to perform oxidization processing through the slit 63.

Accordingly, a portion of the sacrificial film 61 exposed to the slit 63 is oxidized and thus a sacrificial member 51 formed of silicon oxide is formed. Further, an exposed portion of the barrier metal layer 32b to the internal portion of the slit 63 is oxidized and thus a titanium oxide film 64 is formed. In this case, since silicon nitride is easily oxidized when compared with the case of titanium nitride, the sacrificial member 51 has a thickness greater than that of the titanium oxide film 64 in the X direction.

Figure 14C:
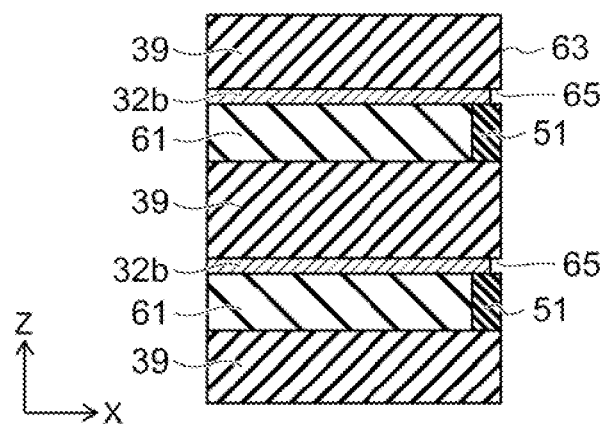

Subsequently, as shown in FIG. 14C, an etching-back is performed through the slit 63 so as to cause the titanium oxide film 64 to be removed. In this case, the sacrificial member 51 remains. Accordingly, the recess 65 extending in the Y direction is formed in the side surface of the slit 63.

Figure 15A:
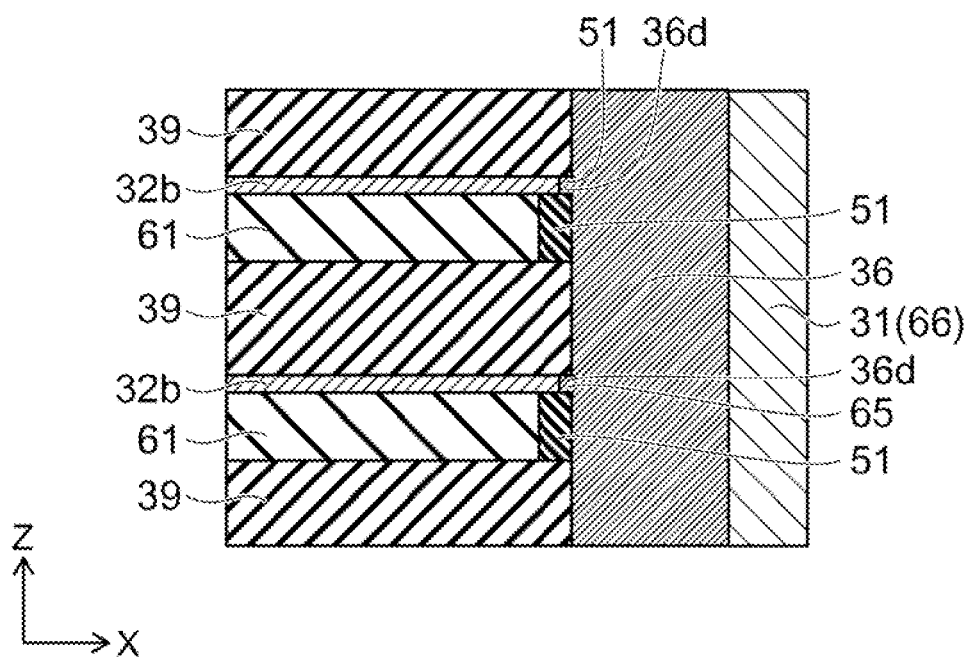
FIG. 15A and FIG. 15B are sectional views showing the manufacturing method of the memory device according to the modification example of the second embodiment.

Subsequently, as shown in FIG. 15A, the GeSbTe layer 36 is formed on the internal face of the slit 63. In this case, the portion 36d of the GeSbTe layer 36 is filled in the recess unit 65 to come in contact with the barrier metal layer 32b. Alternatively, a portion other than the portion 36d in the GeSbTe layer 36 comes in contact with the interlayer insulation film 39 and the insulation member 51. Subsequently, the tungsten film 66 is deposited on the side surface of the GeSbTe layer 36 so as to cause the internal portion of the slit 63 to be filled.

Subsequently, for example, a photolithography method is used to partition the tungsten film 66 and the GeSbTe layer 36 in the Y direction. Accordingly, the tungsten film is machined into a plurality of local bit lines 31. Subsequently, the interlayer insulation film 39 is embedded between the local bit lines 31 and between the GeSbTe layers 36 in the slit 63.

Figure 15B:
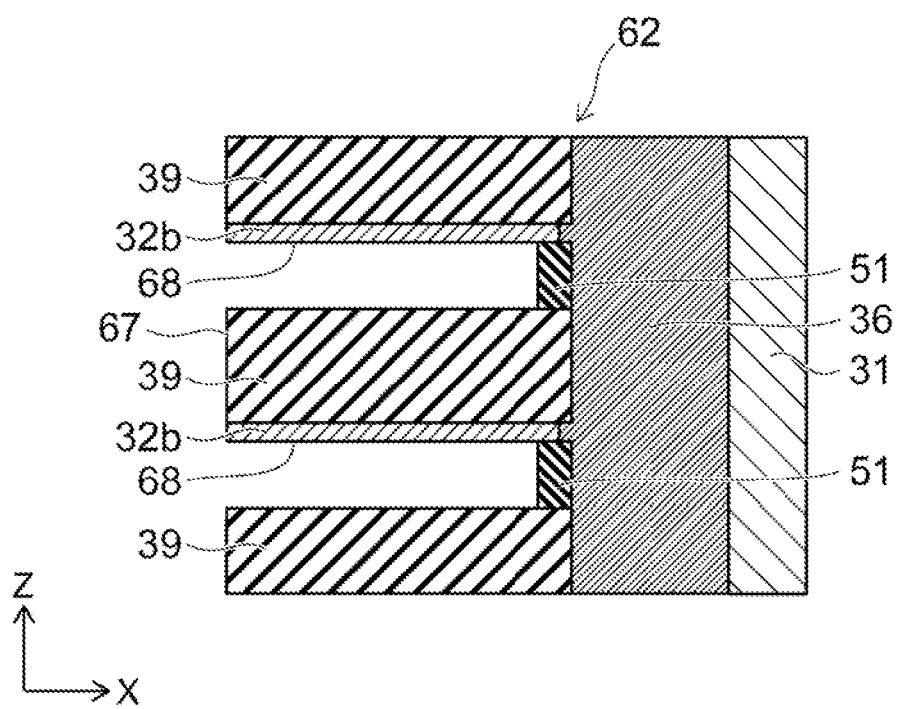

Subsequently, as shown in FIG. 15B, for example, the RIE is performed to form the slit 67 which becomes widened along the YZ plane in a portion which is separate from the slit 63 in the stacked layer body 62. Further, an isotropic etching is performed through the slit 67 so as to cause the sacrificial film 61 to be removed. Accordingly, a recess 68 is formed in the side surface of the slit 67. In this etching, the sacrificial member 51 formed of silicon oxide is not removed but is exposed within the deep inner face of the recess 68.

Subsequently, as shown in FIG. 13, tungsten is embedded in the internal portion of the recess 68 through the slit 67. Subsequently, the etching is performed to remove the tungsten deposited on the external portion of the recess unit 68. As a result, the tungsten remaining in the recess unit 68 is used to form the main body unit 32a of the local word lines 32. The local word line 32 includes the main body unit 32a and the barrier metal layer 32b. Subsequently, the interlayer insulation film 39 is embedded in the internal portion of the slit 67. Accordingly, the memory device 2a according to the modification example is manufactured.

In the modification example, the configuration, the manufacturing method, the operation and the effect other than the description described above are the same as those of the second embodiment.

Further, in the second embodiment and the modification example of the second embodiment, there is provided an example in which the GeSbTe layer 36 is used as the variable resistance layer. However, the second embodiment and the modification example are not limited to the provided example, but the variable resistance layer may be the super lattice layer other than the GeSbTe layer 36. For example, the variable resistance layer may be a layer containing a fourteenth group element such as silicon (Si) or carbon (C), and a compound of a fifteenth group element and a sixteenth group element, such as bismuth-tellurium (BiTe) or the like. Further, the variable resistance layer may be a phase change layer other than the super lattice layer or a variable resistance layer other than the phase change layer.

According to the embodiments described above, it is possible to achieve a memory device in which the interference between the memory cells is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a plurality of bit lines, including first and second bit lines, extending in a first direction away from a substrate;
a plurality of word lines, including first and second word lines, extending in a second direction crossing the first direction and substantially parallel to a surface of the substrate;
an insulating material between the first and second word lines;
a first layer made of a Group IV element, between the first word line and the insulating material and between the first word line and the first bit line; and
a second layer made of a compound of a Group V element and a Group VI element, between the insulating material and the first bit line, wherein
the first word line includes a first portion that is metallic and a second portion between the first portion and the first layer, and
a variable resistance portion in contact with the first and second layers and the second portion of the first word line, contains the Group IV element and the compound of the Group V element and the Group VI element.

2. The device according to claim 1, further comprising:
an oxide layer between the first layer and the first bit line.

3. The device according to claim 1,
wherein the first bit line is made of tungsten and the oxide layer is made of tungsten oxide.

4. The device according to claim 1,
wherein the first layer contains an element of one species selected from a group including germanium, silicon and carbon, and
wherein the second layer contains one of an antimony-tellurium alloy or a bismuth-tellurium alloy.

5. The device according to claim 1, wherein a resistivity of the first layer is higher than a resistivity of the second layer.

6. The device according to claim 1, wherein the second portion is a barrier metal layer.

7. The device according to claim 1, wherein
the plurality of bit lines are evenly spaced apart in the second direction and in a third direction that intersects both the first direction and the second direction; and
the plurality of word lines are evenly spaced apart in the first direction and two word lines are arranged on opposite sides of each bit line in the third direction.

8. The device according to claim 1,
wherein the variable resistance portion is in a first state when the Group IV element locally exists in the compound of the Group V element and the Group VI element, and a second state when the Group V element is diffusely distributed in the compound of the Group V element and the Group VI element.

9. A memory device comprising:
a plurality of bit lines, including first and second bit lines, extending in a first direction away from a substrate;
a plurality of word lines, including first and second word lines, extending in a second direction crossing the first direction and substantially parallel to a surface of the substrate;
an insulating material between the first and second word lines;
a first layer between the first word line and the insulating material;
a second layer between the insulating material and the first bit line, and
a variable resistance layer between the first word line and the first bit line, wherein
the first word line includes a first portion that is metallic and a second portion between the first portion and the first layer and the first portion and the variable resistance layer, and
the variable resistance layer is in contact with the first and second layers, the second portion of the first word line, and the bit line, and contains a Group IV element and a compound of a Group V element and a Group VI element.

10. The device according to claim 9, wherein the first layer is made of the Group IV element, and the second layer is made of the compound of the Group V element and the Group VI element.

11. The device according to claim 9, wherein the first layer is made of the compound of the Group V element and the Group VI element, and the second layer is made of the Group IV element.

12. The device according to claim 9, wherein the variable resistance layer contains germanium, antimony and tellurium.

13. The device according to claim 9, wherein a resistivity of the first layer is higher than a resistivity of the second layer.

14. The device according to claim 9, wherein
the plurality of bit lines are evenly spaced apart in the second direction and in a third direction that intersects both the first direction and the second direction; and
the plurality of word lines are evenly spaced apart in the first direction and two word lines are arranged on opposite sides of each bit line in the third direction.

15. The device according to claim 9,
wherein the variable resistance layer is in a first state when the Group IV element locally exists in the compound of the Group V element and the Group VI element, and a second state when the Group V element is diffusely distributed in the compound of the Group V element and the Group VI element.

16. A memory device comprising:
a plurality of bit lines, including first and second bit lines, extending in a first direction away from a substrate;
a plurality of word lines, including first and second word lines, extending in a second direction crossing the first direction and substantially parallel to a surface of the substrate;
a first insulating layer between the first and second word lines;
a Group IV element layer made of a Group IV element between the first word line and the first bit line; and
a second insulating layer between a first portion of the first word line and the Group IV element layer but not between a second portion of the first word line and the Group IV element layer, wherein a thickness of the first portion is greater than a thickness of the second portion.

17. The device according to claim 16, wherein
a second portion of the first word line is in direct contact with the Group IV element layer.

18. The device according to claim 16, further comprising:
a variable resistance portion between the second portion of the first word line and the Group IV element layer.

19. The device according to claim 18, wherein the variable resistance portion contains the Group IV element and a compound of a Group V element and a Group VI element.

20. The device according to claim 16, wherein
the plurality of bit lines are evenly spaced apart in the second direction and in a third direction that intersects both the first direction and the second direction, each of the bit lines being sandwiched by two Group IV element layers in the third direction; and
the plurality of word lines are evenly spaced apart in the first direction and the third direction.

* * * * *